United States Patent
Chang

(10) Patent No.: US 8,373,217 B2
(45) Date of Patent: Feb. 12, 2013

(54) EPITAXIAL FABRICATION OF FINS FOR FINFET DEVICES

(75) Inventor: Peter L. D. Chang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/212,822

(22) Filed: Aug. 18, 2011

(65) Prior Publication Data

US 2011/0298098 A1    Dec. 8, 2011

Related U.S. Application Data

(63) Continuation of application No. 11/647,987, filed on Dec. 29, 2006, now Pat. No. 8,017,463.

(51) Int. Cl.
*H01L 29/66* (2006.01)
(52) U.S. Cl. .. 257/302; 257/347; 257/328; 257/E21.409
(58) Field of Classification Search .................. 438/197, 438/157; 257/302, 347, 328, E21.409
See application file for complete search history.

(56) References Cited

U.S. PATENT DOCUMENTS

| | | | |
|---|---|---|---|
| 6,815,738 B2 * | 11/2004 | Rim ............................ | 257/256 |
| 6,911,383 B2 | 6/2005 | Doris et al. | |
| 6,967,140 B2 | 11/2005 | Doyle | |
| 7,183,597 B2 | 2/2007 | Doyle | |
| 2004/0036127 A1 | 2/2004 | Chau et al. | |
| 2005/0048727 A1 * | 3/2005 | Maszara et al. ............... | 438/285 |
| 2005/0158959 A1 | 7/2005 | Doyle | |
| 2005/0205932 A1 * | 9/2005 | Cohen .......................... | 257/347 |
| 2005/0215040 A1 | 9/2005 | Doyle | |
| 2005/0227435 A1 | 10/2005 | Oh et al. | |
| 2007/0069293 A1 * | 3/2007 | Kavalieros et al. ............ | 257/350 |

OTHER PUBLICATIONS

S. Monfra Y, et al., "SON (Silicon-On-Nothing) P-MONFETs with totally silicided (CoSi2) Polysilicon on Snm-thik Silms: The simplest way to integration of Metal Gates on thin FD channels", IEDM, 2002 IEEE, pp. 263-266.
S. Monfra Y, et al., "Emerging Silicon-On-Nothing (SON) Devices Technology", Solid-State Electronics 48,2004, pp. 887-895.
Sung-Min Kim, et al., "A Study On Selective Sio.8 Geo.2 Etch Using Polysilicon Etchant Diluted By 20 For Three-Dimensional Si Structure Application", Electrochemical Society Proceedings, vol. 2003-05, pp. 81-86.
Malgorzata Jurczak, "MUGFET—Alternative Transistor Architecture For 32nm CMOS Generation", imec 7th Symposium Diagnostics & Yield, Warsw, Jun. 26-28, 2006, 32 pages total.
Branisla V Curanovic, "Development Of A Fully-Depleted Thin-Body FinFET Process", Thesis—Department Of Microelectronic Engineering, College of Engineering, Rochester Institute Of Technology, Rochester, New York, Nov. 3, 2003, 129 pages.
Y Ang-Kyu Choi, et al., "Nanoscale CMOS Spacer FinFet for the Terait Era", IEEE Electron Device Letters, vol. 23, No. 1, Jan. 2002, pp. 25-27.
H.I. Liu, et al., "Self-Limiting Oxidation For Fabricating Sub-S nm Silicon Nanowires", Appl. , Phys. Lett. 64, Mar. 14, 1994, American Institute of Physics, pp. 1383-1385.
H.I. Liu, et al., "Self-Limiting Oxidation OfSi Nanowires", J.Vac. Sci. Technology, 811(6), Nov./Dec. 1993, pp. 2532-2537.
Yang-Kyu Choi, et al., "A Spacer Patterning Technology for Nanoscale CMOS,", IEEE Transactions on Electron Device, vol. 49, No. 3, Mar. 2002, pp. 436-441.

* cited by examiner

*Primary Examiner* — Michael Trinh
(74) *Attorney, Agent, or Firm* — Blakely, Sokoloff, Taylor & Zafman LLP

(57) ABSTRACT

A fin for a finFET is described. The fin is a portion of a layer of material, where, another portion of the layer of material resides on a sidewall.

18 Claims, 5 Drawing Sheets

US 8,373,217 B2

EPITAXIAL FABRICATION OF FINS FOR FINFET DEVICES

CLAIM TO PRIORITY

This application is a continuation of application U.S. Ser. No. 11/647,987, filed Dec. 29, 2006, entitled, "Epitaxial Fabrication Of Fins For Finfet Devices", now U.S. Pat. No. 8,017,463.

FIELD OF INVENTION

The field of invention relates generally to semiconductor processing and more particularly to the epitaxial fabrication of fins for FinFET transistor devices.

BACKGROUND

FIG. 1 shows a depiction of a FinFET. A FinFET is a transistor built around a thin strip 102 of semiconductor material (referred to as the "fin"). Referring to the depiction of FIG. 1, the transistor includes the standard field effect transistor (FET) nodes: 1) a gate 104; 2) a gate dielectric 103; 3) a source region 102a; and, 4) a drain region 102b. For simplicity the drain and source contacts are not depicted so that the current transport properties of the device can be more easily described in reference to the drawing observed in FIG. 1.

The conductive channel of the device resides on the outer sides of the fin beneath the gate dielectric 103. Specifically, current runs in the + or − z direction along both "sidewalls" of the fin 102 that lie in the yz plane as well as along the top side of the fin 102 that lies in the xz plane. Because the conductive channel essentially resides along the three different outer, planar regions of the fin 102, the particular FinFET of FIG. 1 is typically referred to as a "tri-gate" FinFET. Other types of FinFETs exist (such as "double-gate" FinFETs in which the conductive channel principally resides only along both sidewalls of the fin 102 and not along the top side of the fin 102).

Although different types of FinFETs exist they all share the challenge of building a fin structure. Prior art approaches have traditionally used lithography techniques to form the fin 102. Prior to formation of the gate dielectric 103 and gate structures 104, the surface of a semiconductor substrate 100 is typically deposited with layers of materials, such as silicon nitride on pad oxide, as hardmask for patterning the fin 102. The surface of the hardmask is then coated with a layer of photoresist. The photoresist is subsequently patterned (i.e., electromagnetic radiation is propagated to a mask and then to the photoresist). The photoresist is then removed in certain areas so as to expose regions of the hardmask surface surrounding the region where the fin is to be formed while covering (and therefore protecting) the region of the hardmask surface beneath which the fin is to be formed. Etching of the exposed regions, and subsequent removal of the hardmask materials, 101a, 101b results in the formation of the fin 102.

A problem with the lithographic approach to fin formation, however, is that the sidewalls of the fin may be ill-defined owing to "edge-roughness" or "line-width" issues in the patterning of the photoresist. That is, if the edges of the photoresist used to define the fin 102 within the substrate are "rough", then, the sidewall surfaces of the fin will also be "rough" as a direct consequence of the resist and subsequent etch process. The sidewall roughness on both sidewalls and to some extent the sidewall profile cause fin thickness variation (measured along the x axis) which may adversely affect the performance and/or operation of a FinFET.

BRIEF DESCRIPTION OF THE DRAWINGS

The present invention is illustrated by way of example and not limitation in the figures of the accompanying drawings, in which like references indicate similar elements and in which.

DETAILED DESCRIPTION

A solution to the fin thickness variation problem described above is to form the fin as a layer in the manufacturing process. By forming a fin layer, fin thickness is determined through control of the process parameters used to form the fin layer rather than photolithographic processes. For instance, if the fin is grown with an epitaxial process, the fin's thickness will be determined by the growth dynamics of the epitaxy. Because manufacturing control of layer thickness and uniformity is generally more precise than feature edge control exercised by photolithographic processes, FinFETs whose fin widths are determined through layer formation rather than photolithography offer improved minimum features sizes and packing densities.

Figure 2A:
FIGS. 2A through 2E show a first embodiment for fabricating a fin for a FinFET transistor.

FIGS. 2A through 2E show a method for fabricating a fin for a FinFET where the fin is epitixialy grown such that the fin width dimensions are determined by the epitaxial growth process. FIG. 2A shows a cross section of a "starting" substrate that includes a Silicon (Si) semiconductor substrate 200 and a heterostructure in the form of a $Si_xGe_{1-x}$ layer 201 over the Si substrate 200.

Note that the starting substrate may be formed during wafer processing as a precursor to the processing presently being described. In this case, the $Si_xGe_{1-x}$ layer 201 may be epitaxially grown from the top surface of the semiconductor substrate using known prior art techniques such as Molecular Beam Epitaxy (MBE) or Chemical Vapor Deposition by methods that are well known in the art. The thickness of the $Si_xGe_{1-x}$ layer 201 should be on the order of and probably larger than the desired height of the fins (as measured along the y axis referring to FIG. 1). A hardmask layer (e.g., made of nitride) 202 may then be deposited on the $Si_xGe_{1-x}$ layer 201 (e.g., using known deposition techniques such as plasma sputtering deposition or chemical vapor deposition). A pad oxide (not shown) may also be formed over the hardmask layer 202.

Figure 2B:
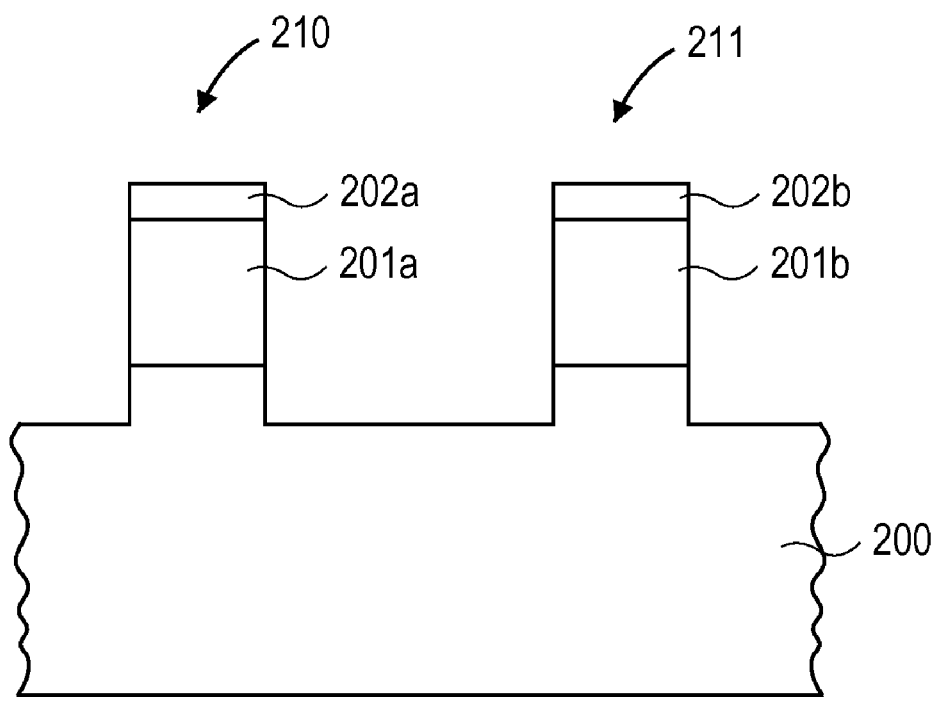

Between FIGS. 2A and 2B a photoresist layer is formed over the starting susbtrate (e.g., by being spun on, deposited, etc.) and patterned so as to expose regions of the substrate. The exposed regions are then etched by a typical dry etching through the hardmask 202 and through the $Si_xGe_{1-x}$ 201 layers and into the upper surface of the Si substrate 200 to form the structure observed in FIG. 2B According to one embodiment, the exposed regions of the substrate are etched into because, as will be seen in more detail below, the non-etched portions of the substrate 200 surface act as foundational support structures for the fins that will be subsequently formed. The etching process results in strips of multilayer structures 210, 211 each respectively comprising a hardmask layer 202a, 202b a $Si_xGe_{1-x}$ layer 201a, 201b and foundations of Si substrate 200 material.

Figure 2C:
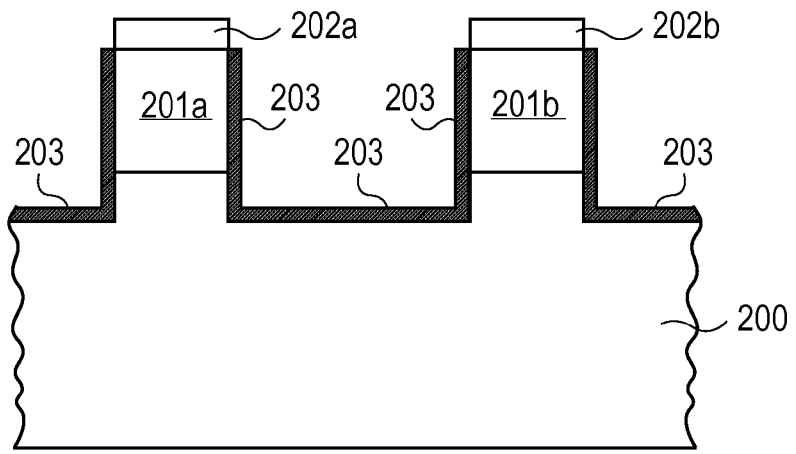

FIG. 2C shows the resulting structure after the layer 203 from which the fins will be formed is epitaxially formed along the $Si_xGe_{1-x}$ and Si edges of the multilayer structures 210, 211 as well as along the exposed, etched surface of the Si susbtrate 200. According to one embodiment, layer 203 is made of Si and is epitaxially formed according to known techniques such as Chemical Vapor Deposition (CVD). Epitaxial formation is the formation of single crystal material (i.e., the atoms that form the layer preserve a crystal lattice structure of a specific type during the formation of the layer). The fact that there may exist different rates of growth as between the growth of the Si layer 203 from the $Si_xGe_{1-x}$ layer 201 and the growth of the Si layer 203 from the exposed Si substrate 200 is not a concern because, as described in more detail below, the useable portion of the fin (that is, the portion of the fin that will conduct its corresponding transistor's current) is epitaxially formed from the $Si_xGe_{1-x}$ layer 201.

Here, the $Si_xGe_{1-x}$ layer 201 is used as a seed layer for the epitaxial formation of the Si layer 203. Here, as is known in the art $Si_xGe_{1-x}$ exhibits approximately the same crystal lattice spacing as Si as long as its thickness is less than the critical thickness for a given x. In general, the critical thickness is reduced as x is reduced. For x approximately equal to 0.8, the critical thickness may be about 100 nm. Thus, a $Si_xGe_{1-x}$ layer where x is approximately 0.8 should provide a suitable lattice spacing for epitaxially forming Si layer 203.

As discussed, given that transistor device fins correspond to Si layer 203, the thickness of the Si layer 203 essentially corresponds to the fin thickness. Importantly, although the etched edges of the multilayer structures 210, 211 are defined by photolithography and therefore may have associated edge profile variations, these variations do not impact the fin width. In one embodiment, an oxidation and etch may be applied to reduce the roughness and remove etch damage. That is, the method produces fixed width fins whose run length shape will conform to the variations along the multilayer structure 210, 211 sidewalls.

Figure 2D:
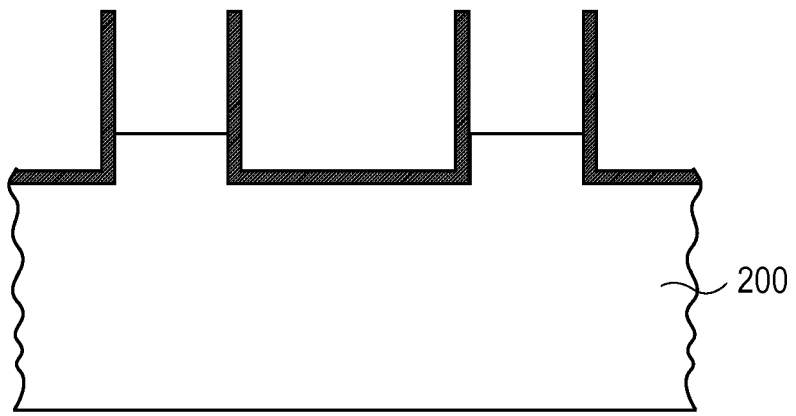

Referring to FIG. 2D, after the Si layer 203 is grown, the hardmask 202a,b and $Si_xGe_{1-x}$ layers 201a,b are selectively etched through chemical etch processes. According to one approach, a fluorine-based wet etch is used to etch the $Si_xGe_{1-x}$ where the wet etchant comprises a solution of nitric acid ($HNO_3$), hydrofluoric acid (HF), acetic acid ($CH_3COOH$), and water ($H_2O$). In a further embodiment, the wet etchant solution may comprise 100 to 150 parts $HNO_3$, 0.25 to 2 parts HF, 200 to 300 parts $CH_3COOH$, and 0 to 50 parts $H_2O$. Suitable relative proportions of $HNO_3$:HF:$CH_3COOH$:$H_2O$ appear to depend on how the $Si_xGe_{1-x}$ is deposited. In one embodiment, the wafer may be oxidized slightly prior to the hardmask removal so that the silicon is protected from the hardmask etch (without oxide protection, pitting defects may form on the silicon fin). Selective etches are used because a selective etch will substantially refrain from etching the Si layer 203 in the case of the hardmask 202 layer etch and will substantially refrain from etching the Si layer 203 and the semiconductor substrate 200 in the case of the $Si_xGe_{1-x}$ layer 201 etch so as to create the structure observed in FIG. 2D.

Figure 2E:
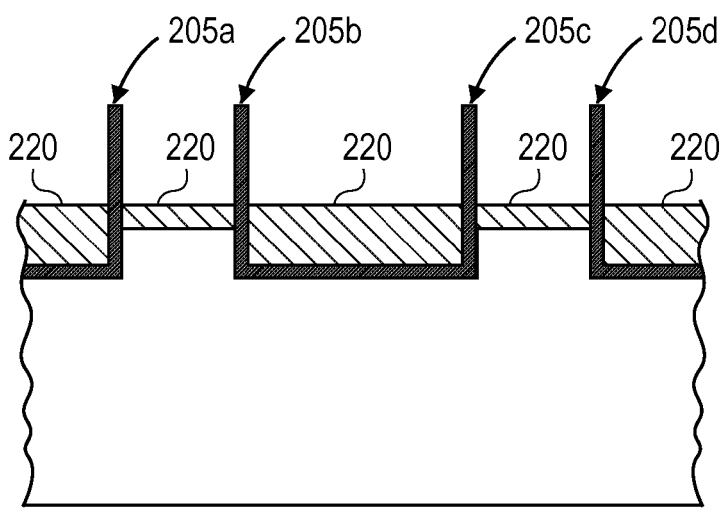

Between FIGS. 2D and 2E a trench oxide is deposited over the wafer whose thickness is greater than that of the exposed fins. The trench oxide is polished down to approximately the tops of the exposed fins. A slight oxidation may be applied at the top of the fins to remove any polish damage. Then, a wet oxide etch using hydrofluoric acid may be used to etch the trench oxide beneath the fins so as to expose the fins 205a,b, c,d as observed in FIG. 2E. From FIG. 2E it is clear that the raised portions of the semiconductor substrate act as foundational support structures for the fins. The thickness of the fin and the height of the fin above the support structure determine the stability of the fin.

Comparing FIG. 2C and FIG. 2E note that the exposed fins 205a,b,c,d correspond to portions of the Si layer 203 that were grown from the $Si_xGe_{1-x}$ layer 201. As such, the thickness of the $Si_xGe_{1-x}$ layer 201 should be no less than (and preferably greater than) the desired fin height. Here, it is expected that fin height will be maximally bounded by fin width in the sense that the thinner the fin, the less the fin is able to stand upright reliably. Once the exposed fins are formed as observed in FIG. 2E, FinFET devices may be built on them.

Figure 1:
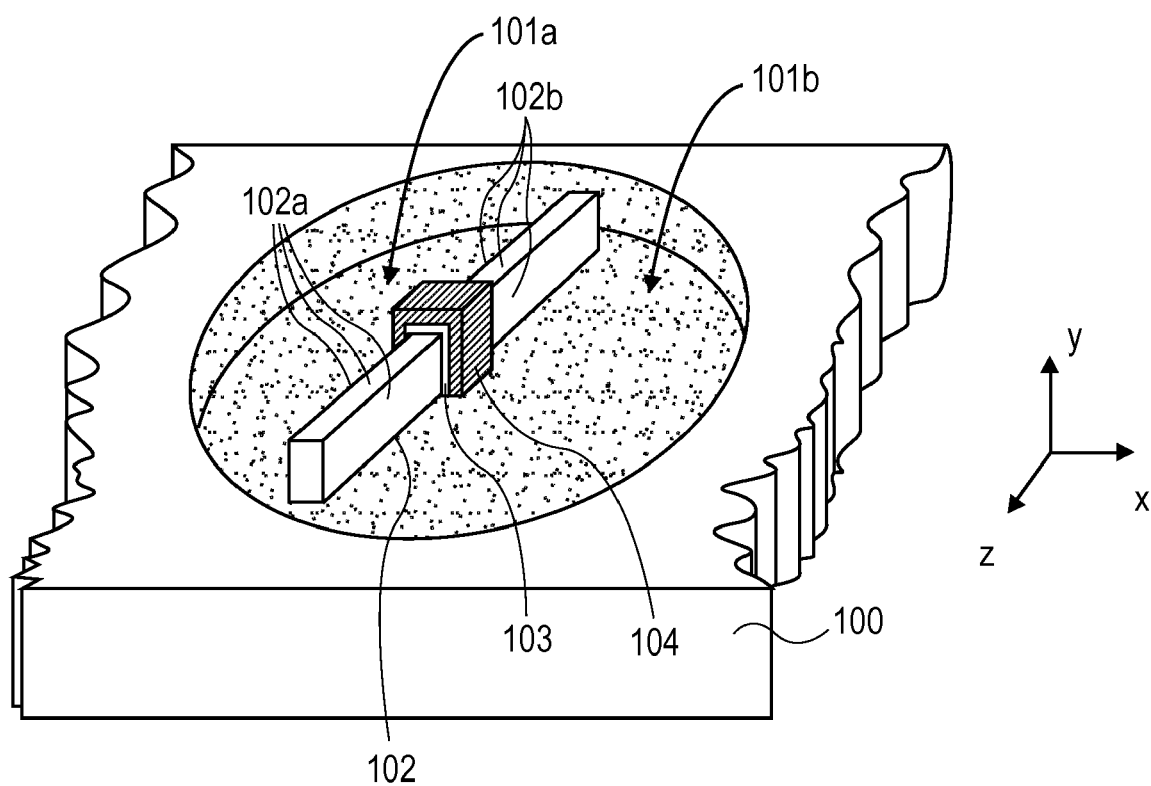
FIG. 1 depicts a trigate FinFET transistor.

Comparing FIGS. 1 and 2C note that the growth of the Si layer 203 should completely line the exposed regions 101a,b. The excess Si can be subsequently removed during formation of the remainder of the FinFET transistor, or, alternatively, a thin layer of chemical oxide (such as) can be grown prior to the growth of the Si layer 203. This oxide is then coated with photoresist and patterned to expose areas of $Si_xGe_{1-x}$ layer 201 where the Si layer growth 203 is desired (namely, the sidewalls of the multiplayer structures). In this case, layer 203 of FIG. 2C will have the approximate structure of an oxide running along the Si substrate surface and the epitaxially grown Si running along the sidewalls of the multilayer structures 210, 211.

Because of the photoresist and patterning, the oxide can be formed along sidewalls that are not used to form a fin (such as the circular sidewalls of regions 101a,b observed in FIG. 1). Leaving oxide on part of the sidewall can break up the connectivity of fins grown on the sidewall. Alternatively, a cut mask may be used to cut out the undesired connectivity between fins.

Figure 3A:
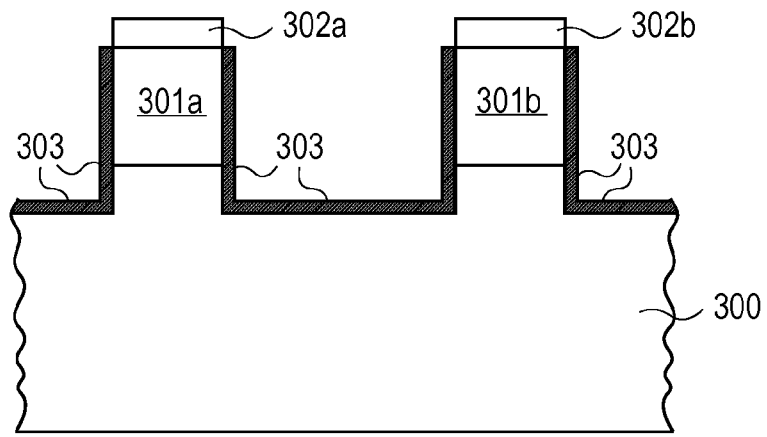
FIGS. 3A through 3E show a second embodiment for fabricating a fin for a FinFET transistor.
Figure 3B:
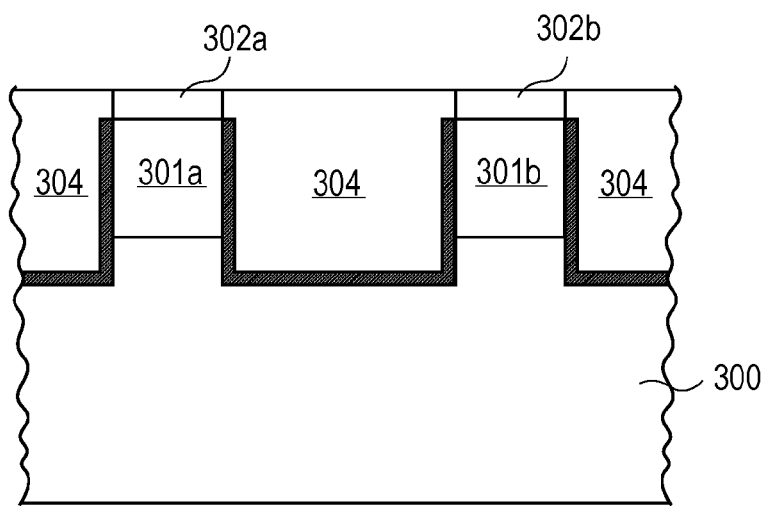
Figure 3C:
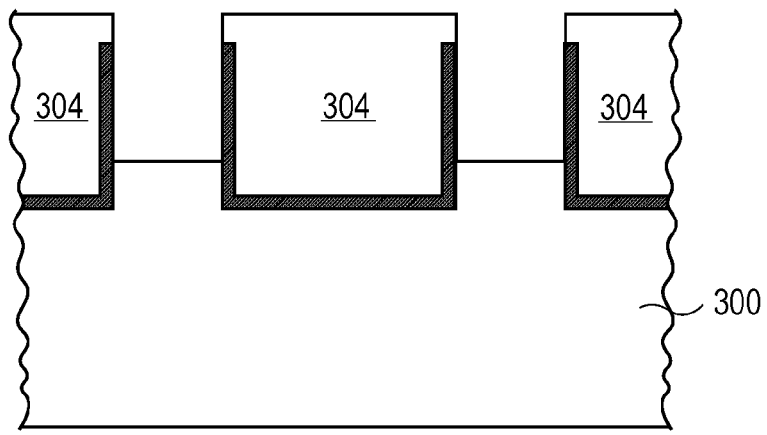

FIGS. 3A through 3E show an alternate approach that provides additional support to the manufactured fins. FIG. 3A is identical to FIG. 2C, therefore the processes described above with respect to FIGS. 2A through 2C may be performed in order to form the structure observed in FIG. 3A. As observed in FIG. 3B, rather than removing the hardmask 302 and $Si_xGe_{1-x}$ layers 301 as was performed with respect to FIG. 2D, a trench oxide 304 is deposited and planarized. Then, as depicted in FIG. 3C, the hardmask 302 and $Si_xGe_{1-x}$ layers 301 are selectively etched. The structure observed in FIG. 3C perhaps provides better structural support for the fins during the fin processing being describe herein because the fins will be supported not only by the foundational support structures of the semiconductor substrate 300a but also by the trench oxide 304.

Figure 3D:
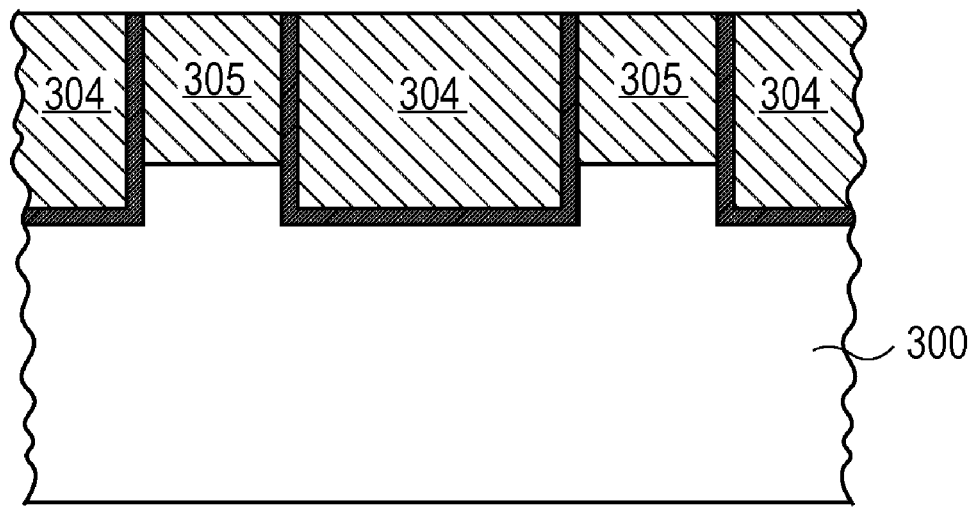
Figure 3E:
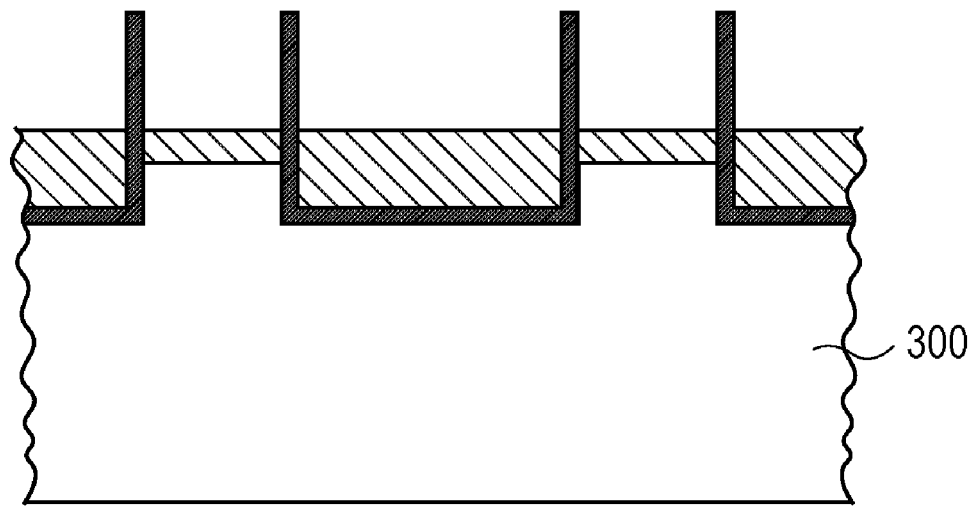

As observed in FIG. 3D a second trench oxide 305 is then deposited and the wafer including both oxides 304, 305 is planarized. The planarization details that may take place between FIGS. 2D and 2E may also be applied to produce the structure observed in FIG. 3E. Again, FinFET transistors may subsequently be built upon the exposed fins.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

I claim:
1. An article of manufacture, comprising:
a FinFET fin, said fin being a portion of a layer of material, another portion of said layer of material residing on a sidewall of a structure composed of silicon germanium on a different semiconductor such that said another por- tion of said layer touches said silicon germanium and said semiconductor, a third portion of said layer of material also touching said semiconductor on a plane that is different than said sidewall's plane.

2. The article of manufacture of claim 1 wherein said semiconductor is part of a substrate.

3. The article of manufacture of claim 2 wherein said semiconductor comprises silicon.

4. The article of manufacture of claim 3 wherein said substrate comprises an insulating material.

5. The article of manufacture of claim 1 wherein said layer of material is epitaxially grown.

6. The article of manufacture of claim 1 wherein said layer of material comprises silicon.

7. The article of manufacture of claim 1 wherein said sidewall includes an etched edge of a substrate.

8. The article of manufacture of claim 7 wherein said substrate comprises silicon.

9. The article of manufacture of claim 3 wherein said substrate comprises an insulating material.

10. the article of manufacture of claim 1 wherein said plane is substantially perpendicular to said sidewall's plane.

11. The article of manufacture of claim 10 wherein said a semiconductor is part of a substrate.

12. The article of manufacture of claim 11 wherein said semiconductor comprises silicon.

13. The article of manufacture of claim 12 wherein said substrate comprises an insulating material.

14. The article of manufacture of claim 10 wherein said layer of material is epitaxially grown.

15. The article of manufacture of claim 10 wherein said layer of material comprises silicon.

16. The article of manufacture of claim 10 wherein said sidewall includes an etched edge of a substrate.

17. The article of manufacture of claim 16 wherein said substrate comprises silicon.

18. The article of manufacture of claim 17 wherein said substrate comprises an insulating material.

* * * * *